United States Patent
Libbert et al.

(10) Patent No.: US 9,209,069 B2
(45) Date of Patent: Dec. 8, 2015

(54) METHOD OF MANUFACTURING HIGH RESISTIVITY SOI SUBSTRATE WITH REDUCED INTERFACE CONDUCTIVITY

(71) Applicant: SunEdison Semiconductor Limited (UEN201334164H), Singapore (SG)

(72) Inventors: Jeffrey L. Libbert, O'Fallon, MO (US); Shilpi Vaypayee, St. Peters, MO (US)

(73) Assignee: SunEdison Semiconductor Limited (UEN201334164H), Singapore (SG)

(*) Notice: Subject to any disclaimer, the term of this patent is extended or adjusted under 35 U.S.C. 154(b) by 0 days.

(21) Appl. No.: 14/510,929

(22) Filed: Oct. 9, 2014

(65) Prior Publication Data
US 2015/0104926 A1    Apr. 16, 2015

Related U.S. Application Data (60) Provisional application No. 61/891,040, filed on Oct. 15, 2013.

(51) Int. Cl.
*H01L 21/00* (2006.01)
*H01L 21/762* (2006.01)

(52) U.S. Cl.
CPC ................. *H01L 21/76254* (2013.01)

(58) Field of Classification Search
CPC ................................. H01L 21/76254
See application file for complete search history.

(56) References Cited

U.S. PATENT DOCUMENTS

| | | | |
|---|---|---|---|
| 4,755,865 A | 7/1988 | Wilson et al. | |
| 5,189,500 A | 2/1993 | Kusunoki | |
| 6,043,138 A | 3/2000 | Ibok | |
| 6,373,113 B1 | 4/2002 | Gardner et al. | |
| 6,562,127 B1* | 5/2003 | Kud et al. | 117/94 |
| 6,624,047 B1* | 9/2003 | Sakaguchi et al. | 438/458 |
| 7,868,419 B1 | 1/2011 | Kerr et al. | |
| 7,915,706 B1 | 3/2011 | Kerr et al. | |
| 8,076,750 B1 | 12/2011 | Kerr et al. | |
| 8,466,036 B2 | 6/2013 | Brindle et al. | |
| 8,481,405 B2 | 7/2013 | Arriagada et al. | |
| 2007/0032040 A1 | 2/2007 | Lederer | |
| 2012/0161310 A1 | 6/2012 | Brindle et al. | |
| 2012/0238070 A1* | 9/2012 | Libbert et al. | 438/455 |
| 2013/0168835 A1 | 7/2013 | Botula et al. | |

FOREIGN PATENT DOCUMENTS

| | | |
|---|---|---|
| EP | 0939430 A2 | 1/1999 |
| WO | 2009120407 A2 | 1/2009 |

OTHER PUBLICATIONS

Gamble, H.S. et al., "Low-Loss CPW Lines on Surface Stabilized High-Resistivity Silicon," IEEE Microwave and guided Wave Letter, Oct. 1999, pp. 395-397, vol. 9, No. 10.

(Continued)

*Primary Examiner* — Angel Roman
(74) *Attorney, Agent, or Firm* — Armstrong Teasdale LLP (57) ABSTRACT

A method of preparing a high resistivity single crystal semiconductor handle wafer comprising implanting He ions through a front surface of the high resistivity single crystal semiconductor handle wafer, which is followed by an anneal sufficient to form a nanocavity layer in the damage region formed by He ion implantation. The anneal may be prior to or concurrent with thermal oxidation to prepare a front oxidized surface layer.

60 Claims, 2 Drawing Sheets

(56) References Cited

OTHER PUBLICATIONS

Lederer, D. et al. "Enhanced High Resistivity SOI wafers for RF applications," IEEE International SOI Conference, Oct. 2004, pp. 46-47.

Lederer, D. et al. "New Substrate Passivation Method Dedicated to HR SOI Wafer Fabrication With Increased Substrate Resistivity," IEEE Electron Device Letters, Nov. 2005, pp. 805-807, vol. 26, No. 11.

Lederer, D. et al. "Performance of SOI devices transferred onto passivated HR SOI substrates using a layer transfer technique," IEEE International SOI Conference, 2006, pp. 29-30.

Kerr, Daniel C., "Identification of RF harmonic distortion on Si substrates and its reduction using a trap-rich layer," Silicon Monolithic Integrated Circuits in RF Systems, 2008, pp. 151-154, SiRF 2008 (IEEE Topical Meeting).

* cited by examiner

METHOD OF MANUFACTURING HIGH RESISTIVITY SOI SUBSTRATE WITH REDUCED INTERFACE CONDUCTIVITY

CROSS REFERENCE TO RELATED APPLICATION(S)

This application claims priority to U.S. provisional application Ser. No. 61/891,040, filed Oct. 15, 2013, the disclosure of which is hereby incorporated by reference as if set forth in its entirety.

THE FIELD OF THE INVENTION

The present invention generally relates to a method for forming a semiconductor-on-insulator (e.g., silicon-on-insulator) structure, and more particularly to a method for producing a highly damaged layer in the handle wafer of the semiconductor-on-insulator structure, wherein the damage region is formed at the region near the oxide interface.

BACKGROUND OF THE INVENTION

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, or gallium arsenide.

Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. Generally, the device layer is between 0.01 and 20 micrometers thick, such as between about 0.05 and 20 micrometers thick. In general, composite layer structures, such as silicon-on-insulator (SOI), silicon-on-sapphire (SOS), and silicon-on-quartz, are produced by placing two wafers in intimate contact, followed by a thermal treatment to strengthen the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the carrier wafer and then slowly etched away until only a thin layer of silicon on the carrier wafer remains. See, e.g., U.S. Pat. No. 5,189,500, the disclosure of which is incorporated herein by reference as if set forth in its entirety. This method is time-consuming and costly, wastes one of the substrates and generally does not have suitable thickness uniformity for layers thinner than a few microns.

Another common method of achieving layer transfer utilizes a hydrogen implant followed by thermally induced layer splitting. Particles (e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds deposited on the wafer during the implantation process.

The front surface of the donor wafer is then bonded to a carrier wafer to form a bonded wafer through a hydrophilic bonding process. Prior to bonding, the donor wafer and/or carrier wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor water and carrier wafer hydrophilic. The wafers are then pressed together and a bond is formed there between. This bond is relatively weak, and must be strengthened before further processing can occur.

In some processes, the hydrophilic bond between the donor wafer and carrier wafer (i.e., a bonded wafer) is strengthened by heating or annealing the bonded wafer pair. In some processes, wafer bonding may occur at low temperatures, such as between approximately 300° C. and 500° C. In some processes, wafer bonding may occur at high temperatures, such as between approximately 800° C. and 1100° C. The elevated temperatures cause the formation of covalent bonds between the adjoining surfaces of the donor wafer and the carrier wafer, thus solidifying the bond between the donor wafer and the carrier wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of a crack along the cleave plane, thus separating a portion of the donor wafer. This method allows for better uniformity of the transferred layer and allows recycle of the donor wafer, but typically requires heating the implanted and bonded pair to temperatures approaching 500° C.

The use of semiconductor-on-insulator (e.g., silicon-on-insulator) structures comprising high resistivity base wafers for RF related devices such as antenna switches offers benefits over traditional substrates in terms of cost and integration. To reduce parasitic power loss and minimize harmonic distortion inherent when using conductive substrates for high frequency applications it is necessary, but not sufficient, to use substrate wafers with a high resistivity. Accordingly, the resistivity of the handle wafer for an RF device is generally greater than about 500 Ohm-cm, such as greater than about 1 kiloohm-cm. An example silicon on insulator structure comprises a very high resistivity silicon wafer, a buried oxide (BOX) layer, and a silicon device layer. Such a substrate is prone to formation of high conductivity charge inversion or accumulation layers at the BOX/handle interface causing generation of free carriers (electrons or holes), which reduce the effective resistivity of the substrate and give rise to parasitic power losses and device nonlinearity when the devices are operated at RF frequencies. These inversion/accumulation layers can be due to BOX fixed charge, oxide trapped charge, interface trapped charge, and even DC bias applied to the devices themselves.

A method is required therefore to trap the charge in any induced inversion or accumulation layers so that the high resistivity of the substrate is maintained even in the very near surface region. A number of methods have been suggested to form these high interface trap layers. One of the methods proposed is the deposition of a defective layer such as polycrystalline silicon onto the handle surface. It has been shown in academic studies that the polysilicon layer in between of the oxide and substrate improves the device isolation, decreases transmission line losses and reduces harmonic distortions. See, for example: H. S. Gamble, et al. "Low-loss CPW lines on surface stabilized high resistivity silicon," *Microwave Guided Wave Lett.*, 9(10), pp. 395-397, 1999; D. Lederer, R. Lobet and J.-P. Raskin, "Enhanced high resistivity SOI wafers for RF applications," *IEEE Intl. SOI Conf.*, pp. 46-47, 2004; D. Lederer and J.-P. Raskin, "New substrate passivation method dedicated to high resistivity SOI wafer fabrication with increased substrate resistivity," *IEEE Electron Device Letters*, vol. 26, no. 11, pp. 805-807, 2005; D. Lederer, B. Aspar, C. Laghaé and J.-P. Raskin, "Performance of RF passive structures and SOI MOSFETs transferred on a passivated HR SOI substrate," *IEEE International SOI Conference*, pp. 29-30, 2006; and Daniel C. Kerret al. "Identification of RF harmonic distortion on Si substrates and its reduction using a trap-rich layer", Silicon Monolithic Integrated Circuits in RF Systems, 2008. SiRF 2008 (IEEE Topical Meeting), pp. 151-154, 2008. An alternative method is the implantation of heavy ions to create a near surface damage layer. One problem that arises with these methods is that the defect density in the layer and interface tend to anneal out and become less effective at charge trapping as the wafers are subjected to the thermal processes required to make the wafers and build devices on them.

SUMMARY OF THE INVENTION

Briefly, the present invention is directed to a method of preparing a single crystal semiconductor handle wafer. The method comprises implanting He ions through a front surface of the single crystal semiconductor handle wafer to thereby form an implant plane having a peak depth, $D_1$, as measured from the front surface of the single crystal semiconductor handle wafer and toward a central plane of the single crystal semiconductor handle wafer, the single crystal semiconductor handle wafer comprising two major, generally parallel surfaces, one of which is the front surface of the single crystal semiconductor handle wafer and the other of which is a back surface of the single crystal semiconductor handle wafer, a circumferential edge joining the front and back surfaces of the single crystal semiconductor handle wafer, a bulk single crystal semiconductor region, and the central plane of the single crystal semiconductor handle wafer between the front and back surfaces of the single crystal semiconductor handle wafer, wherein the single crystal semiconductor handle wafer has a minimum bulk resistivity of at least 100 ohm-cm, the peak depth $D_1$ comprises the depth of the highest concentration of He ions in the single crystal semiconductor handle wafer, and the peak depth $D_1$ is no greater than about 5 micrometers from the front surface of the single crystal semiconductor handle wafer; and thermally oxidizing the front surface of the single crystal semiconductor handle wafer to thereby prepare a front oxidized surface layer having an average thickness, $D_2$, as measured between a point on a surface of the front oxidized surface layer and an interface of the oxidized surface layer and the bulk single crystal semiconductor region.

The present invention is further directed to a method of preparing a silicon-on-insulator structure. The method comprises bonding a front surface of a single crystal silicon handle substrate and a front surface of a single crystal silicon donor substrate. The single crystal silicon handle substrate comprises two major, generally parallel surfaces, one of which is the front surface of the single crystal silicon handle substrate and the other of which is a back surface of the single crystal silicon handle substrate, a circumferential edge joining the front and back surfaces of the single crystal silicon handle substrate, and a central plane of the single crystal silicon handle substrate between the front and back surfaces of the single crystal silicon handle substrate, wherein the single crystal silicon handle substrate has a minimum bulk resistivity of 100 ohm-cm, the front surface of the single crystal silicon handle substrate comprises an oxidized front surface layer, and the single crystal silicon handle substrate comprises a nanocavity layer having an average depth, $D_3$, as measured from a point on the oxidized front surface of the single crystal silicon handle substrate and toward the central plane of the single crystal silicon handle substrate. The single crystal silicon donor substrate comprises two major, generally parallel surfaces, one of which is the front surface of the single crystal silicon donor substrate and the other of which is a back surface of the single crystal silicon donor substrate, a circumferential edge joining the front and back surfaces of the single crystal silicon donor substrate, and a central plane of the single crystal silicon donor substrate between the front and back surfaces of the single crystal silicon donor substrate, wherein the single crystal silicon donor substrate comprises a cleave plane.

The present invention is still further directed to a method of preparing a silicon-on-insulator structure. The method comprises implanting He ions through a front surface of a single crystal semiconductor handle wafer to thereby form an implant plane having a peak depth, $D_1$, as measured from the front surface of the single crystal semiconductor handle wafer and toward a central plane of the single crystal semiconductor handle wafer, the single crystal semiconductor handle wafer comprising two major, generally parallel surfaces, one of which is the front surface of the handle wafer and the other of which is a back surface of the handle wafer, a circumferential edge joining the front and back surfaces of the handle wafer, a bulk single crystal semiconductor region, and the central plane of the single crystal semiconductor handle wafer between the front and back surfaces of the single crystal semiconductor handle wafer, wherein the single crystal semiconductor handle wafer has a minimum bulk resistivity of at least 100 ohm-cm, the peak depth $D_1$ comprises the depth of the highest concentration of He ions in the single crystal semiconductor handle wafer, and the peak depth $D_1$ is no greater than about 5 micrometers from the front surface of the single crystal semiconductor handle wafer; thermal annealing the He ion implanted single crystal semiconductor handle wafer to form a nanocavity layer in the single crystal semiconductor handle wafer; and bonding the front surface of the single crystal semiconductor handle wafer and a front surface of a single crystal silicon donor substrate, wherein the single crystal silicon donor substrate comprises two major, generally parallel surfaces, one of which is the front surface of the single crystal silicon donor substrate and the other of which is a back surface of the single crystal silicon donor substrate, a circumferential edge joining the front and back surfaces of the single crystal silicon donor substrate, a central plane of the single crystal silicon donor substrate between the front and back surfaces of the single crystal silicon donor substrate, and a cleave plane.

Other objects and features of this invention will be in part apparent and in part pointed out hereinafter.

DETAILED DESCRIPTION OF THE EMBODIMENT(S) OF THE INVENTION

According to the present invention, a method is provided for producing a highly damaged layer in a single crystal semiconductor handle substrate, e.g., a single crystal semiconductor handle wafer. The single crystal semiconductor handle wafer comprising the highly damaged layer is useful in the production of a semiconductor-on-insulator (e.g., silicon-on-insulator) structure. According to the present invention, the damage region in the single crystal semiconductor handle wafer is formed at the region near the oxide interface. Advantageously, the method of the present invention provides a highly defective layer that is stable against thermal processing, such as subsequent thermal process steps in the production of the semiconductor-on-insulator substrate and device manufacture.

In some embodiments, the method of the present invention is directed to producing a highly defective layer at the handle/buried oxide ("BOX")) interface of a semiconductor-on-insulator (e.g., silicon-on-insulator) structure. According to the method of the present invention, helium ions are implanted into the single crystal semiconductor handle wafer so that the projected range of the implant is just deeper than the semiconductor material (e.g., silicon) consumed during a handle oxidation step. The single crystal semiconductor handle wafer is oxidized to consume the semiconductor material down to the end of range damage region. This surviving damage region acts as a high density trap region to kill the conductivity of induced charge inversion or accumulation layers that can contribute to power loss and non-linear behavior in electronic devices designed for RF operation.

The substrates for use in the present invention include a semiconductor handle substrate, e.g., a single crystal semiconductor handle wafer and a semiconductor donor substrate, e.g., a single crystal semiconductor donor wafer. The semiconductor device layer in a semiconductor-on-insulator composite structure is derived from the single crystal semiconductor donor wafer. The semiconductor device layer may be transferred onto the semiconductor handle substrate by wafer thinning techniques such as etching a semiconductor donor substrate or by cleaving a semiconductor donor substrate comprising a damage plane. In general, the single crystal semiconductor handle wafer and single crystal semiconductor donor wafer comprise two major, generally parallel surfaces. One of the parallel surfaces is a front surface of the substrate, and the other parallel surface is a back surface of the substrate. The substrates comprise a circumferential edge joining the front and back surfaces, and a central plane between the front and back surfaces. The substrates additionally comprise an imaginary central axis perpendicular to the central plane and a radial length that extends from the central axis to the circumferential edge. In addition, because semiconductor substrates, e.g., silicon wafers, typically have some total thickness variation (TTV), warp, and bow, the midpoint between every point on the front surface and every point on the back surface may not precisely fall within a plane. As a practical matter, however, the TTV, warp, and bow are typically so slight that to a close approximation the midpoints can be said to fall within an imaginary central plane which is approximately equidistant between the front and back surfaces.

Prior to any operation as described herein, the front surface and the back surface of the substrate may be substantially identical. A surface is referred to as a "front surface" or a "back surface" merely for convenience and generally to distinguish the surface upon which the operations of method of the present invention are performed. In the context of the present invention, a "front surface" of a single crystal semiconductor handle substrate, e.g., a single crystal silicon handle wafer, refers to the major surface of the substrate that becomes an interior surface of the bonded structure. It is upon this front surface that the wide bandgap layer is formed. Accordingly, a "back surface" of a single crystal semiconductor handle substrate, e.g., a handle wafer, refers to the major surface that becomes an exterior surface of the bonded structure. Similarly, a "front surface" of a single crystal semiconductor donor substrate, e.g., a single crystal silicon donor wafer, refers to the major surface of the single crystal semiconductor donor substrate that becomes an interior surface of the bonded structure, and a "back surface" of a single crystal semiconductor donor substrate, e.g., a single crystal silicon donor wafer, refers to the major surface that becomes an exterior surface of the bonded structure. Upon completion of conventional bonding and wafer thinning steps, the single crystal semiconductor donor substrate forms the semiconductor device layer of the semiconductor-on-insulator (e.g., silicon-on-insulator) composite structure.

The single crystal semiconductor handle substrate and the single crystal semiconductor donor substrate may be single crystal semiconductor wafers. In preferred embodiments, the semiconductor wafers comprise a material selected from the group consisting of silicon, silicon carbide, silicon germanium, silicon nitride, silicon dioxide, gallium arsenide, gallium nitride, indium phosphide, indium gallium arsenide, germanium, and combinations thereof. The single crystal semiconductor wafers, e.g., the single crystal silicon handle wafer and single crystal silicon donor wafer, of the present invention typically have a nominal diameter of at least about 150 mm, at least about 200 mm, at least about 250 mm, at least about 300 mm, at least about 400 mm, at least about 450 mm, or more. Wafer thicknesses may vary from about 250 micrometers to about 1500 micrometers, suitably within the range of about 500 micrometers to about 1000 micrometers.

In particularly preferred embodiments, the single crystal semiconductor wafers comprise single crystal silicon wafers which have been sliced from a single crystal ingot grown in accordance with conventional Czochralski crystal growing methods or float zone growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). Preferably, the wafers are polished and cleaned by standard methods known to those skilled in the art. See, for example, W. C. O'Mara et al., *Handbook of Semiconductor Silicon Technology*, Noyes Publications. If desired, the wafers can be cleaned, for example, in a standard SC1/SC2 solution. In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 150 mm, at least about 200 mm, at least about 250 mm, at least about 300 mm, at least about 400 mm, at least about 450 mm, or more. Preferably, both the single crystal silicon handle wafer and the single crystal silicon donor wafer have mirror-polished front surface finishes that are free from surface defects, such as scratches, large particles, etc. Wafer thickness may vary from about 250 micrometers to about 1500 micrometers, suitably within the range of about 500 micrometers to about 1000 micrometers. In some specific embodiments, the wafer thickness may be about 725 micrometers.

In some embodiments, the single crystal semiconductor wafers, i.e., handle wafer and donor wafer, comprise interstitial oxygen in concentrations that are generally achieved by the Czochralski-growth method. In some embodiments, the semiconductor wafers comprise oxygen in a concentration between about 4 PPMA and about 18 PPMA. In some embodiments, the semiconductor wafers comprise oxygen in a concentration between about 10 PPMA and about 35 PPMA. Preferably, the single crystal silicon handle wafer comprises oxygen in a concentration of no greater than about 10 ppma. Interstitial oxygen may be measured according to SEMI MF 1188-1105.

In some embodiments, the semiconductor handle substrate, e.g., a single crystal semiconductor handle substrate, such as a single crystal silicon handle wafer, has a relatively high minimum bulk resistivity. High resistivity wafers are generally sliced from single crystal ingots grown by the Czochralski method or float zone method. Cz-grown silicon wafers may be subjected to a thermal anneal at a temperature ranging from about 600° C. to about 1000° C. in order to annihilate thermal donors caused by oxygen that are incorporated during crystal growth. In some embodiments, the single crystal semiconductor handle wafer has a minimum bulk resistivity of at least 100 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 2000 Ohm-cm and about 10,000 Ohm-cm, between about 3000 Ohm-cm and about 10,000 Ohm-cm, or between about 3000 Ohm cm and about 5,000 Ohm-cm. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

In some embodiments, the front surface of the semiconductor handle wafer is cleaned to remove all oxide prior to ion implantation such that the front surface of the wafer lacks even a native oxide layer. The native oxide may be removed by standard etching techniques. In some embodiments, the semiconductor wafer may be subjected to a vapor phase HCl etch process in a horizontal flow single wafer epitaxial reactor using $H_2$ as a carrier gas.

Figure 1:
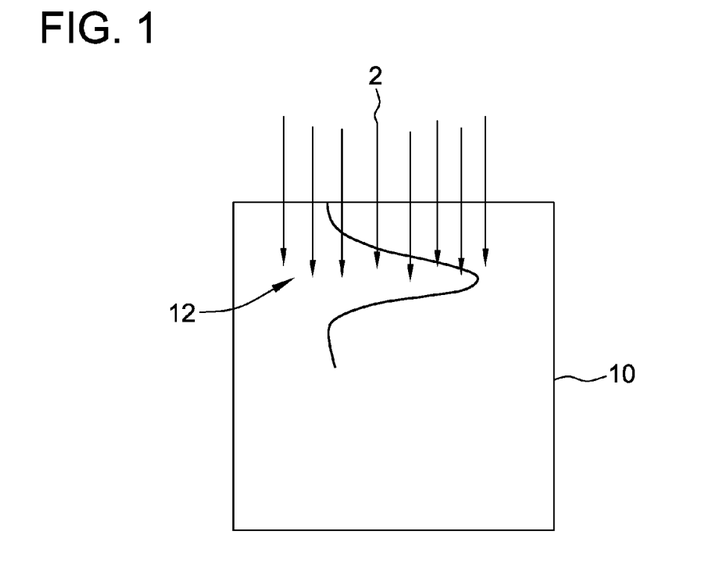
FIG. 1 is a depiction of He ion implantation into a single crystal silicon handle wafer. The He ion concentration acquires a bell curve distribution in the bulk region of the single crystal silicon handle wafer.
Figure 2:
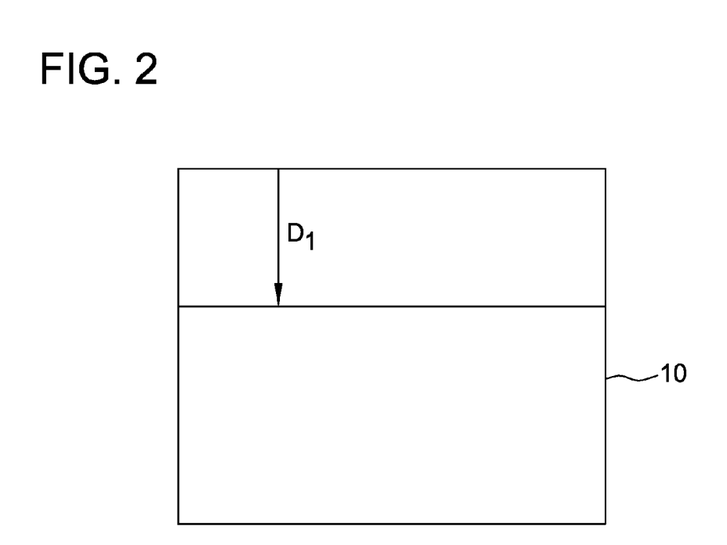
FIG. 2 is a depiction of a single crystal silicon handle wafer having an implant plane having a peak depth of helium damage at a distance, $D_1$, as measured from the front surface of the single crystal silicon handle wafer.

According to some embodiments of the method of the present invention, a single crystal semiconductor handle wafer is subjected to He ion implantation to thereby form an implant plane in the single crystal semiconductor handle wafer. Ion implantation may be carried out in a commercial available instrument, such as an Applied Materials Quantum II. In some embodiments, the method comprises implanting helium ions (e.g., $He^+$ ions) through the front surface of the single crystal semiconductor handle wafer to a peak depth $D_1$ as measured from the front surface toward the central plane. See FIG. 1, which depicts He ion implantation 2 into a single crystal silicon handle wafer 10 in cross section, and FIG. 2 which illustrates a simplified depiction of the single crystal silicon handle silicon wafer 10 in cross section showing the peak depth $D_1$ of the helium ion implant plane. As shown in FIG. 1, the concentration of He ions generally takes the shape of a bell curve 12 comprising an apex of highest concentration of He ions, with the concentration of He ions generally decreasing toward both the front surface of the region and toward the central plane of the silicon wafer 10. The peak depth $D_1$ depicted as a the apex of the bell curve in FIG. 1 and a simple line in the cross section of the silicon wafer of FIG. 2 comprises the depth of the highest concentration of He ions in the single crystal silicon handle wafer.

In some embodiments, the peak depth, $D_1$, of implanted helium ions may be no greater than about 5 micrometers from the front surface of the single crystal semiconductor handle wafer. In some embodiments, the peak depth $D_1$ is between about 0.1 micrometers and about 1 micrometer as measured from the front surface of the single crystal semiconductor handle wafer and toward a central plane of single crystal semiconductor handle wafer. In some embodiments, the peak depth $D_1$ is between about 0.2 micrometers and about 0.5 micrometers as measured from the front surface of the single crystal semiconductor handle wafer and toward a central plane of the single crystal semiconductor handle wafer. In some embodiments, the total helium ion implantation dosage may range from about $5 \times 10^{15}$ helium ions/$cm^2$ to about $5 \times 10^{17}$ helium ions/$cm^2$, such as between about $1 \times 10^{16}$ helium ions/$cm^2$ and about $1 \times 10^{17}$ atoms/$cm^2$. Helium implantation generally occurs at an implant energy sufficient to achieve the desired He implant depth, such as between about 1 keV and about 3,000 keV, or between about 10 keV and about 300 keV, between about 20 keV and about 200 keV, such as about 20 keV to about 100 keV.

In some embodiments it may be desirable to subject the single crystal semiconductor handle wafer to a clean after the implant. In some preferred embodiments, the clean could include a Piranha clean followed by a distilled and/or deionized water rinse and SC1/SC2 cleans.

According to some embodiments of the method of the present invention, the He ion implanted single crystal semiconductor handle substrate, e.g., a He ion implanted single crystal silicon handle wafer, may be subjected to a thermal anneal to form the nanocavity layer prior to but separate from the oxidation cycle. The He ion implanted single crystal semiconductor handle substrate may be thermally annealed in a furnace such as an ASM A400. The temperature may range from 750° C. to 1100° C. in an inert ambient, such as argon, nitrogen or other inert gas. The duration may be up to about 2 hours, such as between about 10 minutes and about 1 hour. In some embodiments, after formation of a nanocavity layer, the single crystal semiconductor handle substrate may be subjected to a thermal oxidation cycle to cause the formation of an oxidized front surface layer, as further detailed below.

Figure 3:
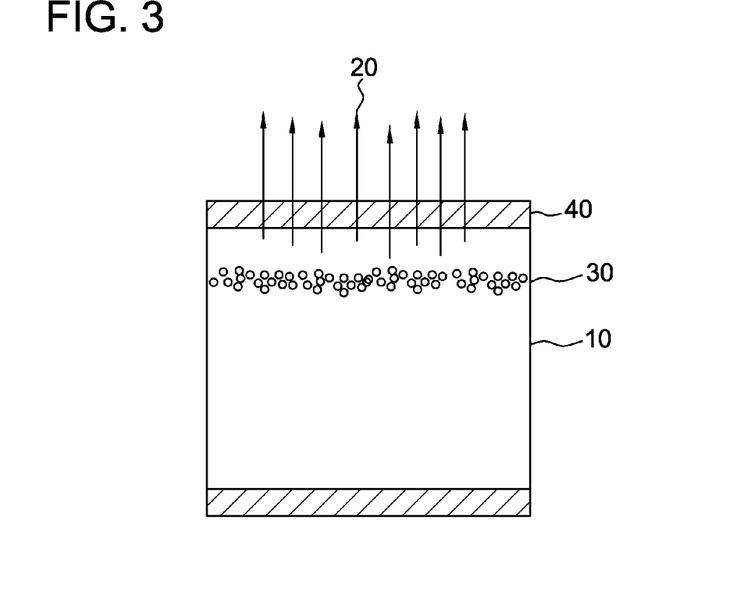
FIG. 3 is a depiction of the oxidation process of a single crystal silicon handle wafer previously implanted with He ions. During thermal oxidation of the front surface of a wafer, a nanocavity layer is formed near the depth of the peak He concentration, which is herein depicted as occurring with He out-diffusion.
Figure 4:
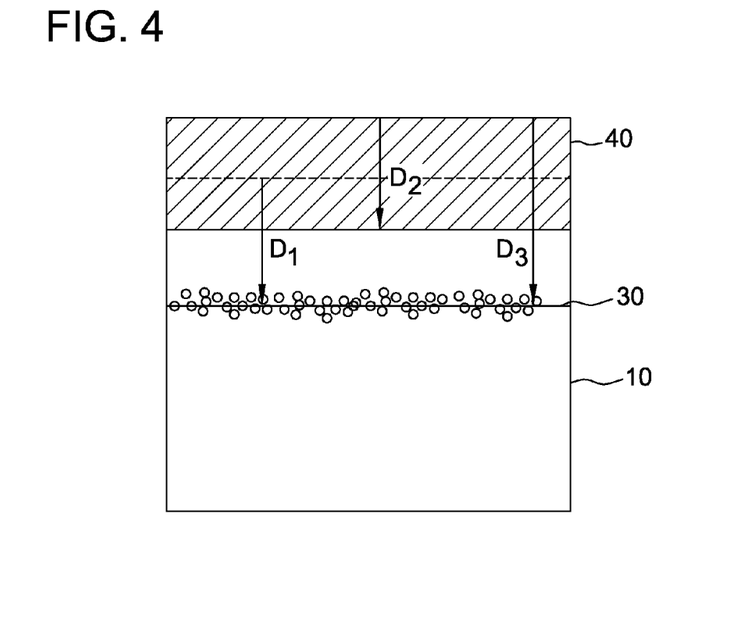
FIG. 4 is a depiction of a single crystal silicon handle wafer having a silicon oxide layer having a thickness, $D_2$, as measured from the front surface of the single crystal silicon handle wafer and a nanocavity layer at a distance, $D_3$, as measured from the front surface of the wafer. The pre-oxidation peak depth of helium damage at a distance, $D_1$, as measured from the front surface of the single crystal silicon handle wafer is provided for reference.

According to some embodiments of the method of the present invention, the front surface of the single crystal semiconductor handle wafer is thermally oxidized to prepare an oxidized front surface layer having an average thickness, $D_2$, as measured between a point on a surface of the oxidized front surface layer and an interface of the oxidized surface layer and the bulk single crystal semiconductor region. During this process step, thermal oxidation of the front surface may further include formation of a nanocavity layer and subsequent out diffusion of implanted helium ions. That is, a thermal oxidation cycle may be sufficient to form both a surface oxidation layer and form a nanocavity layer, thereby obviating the need for a separate thermal anneal cycle. See FIG. 3, which illustrates nanocavity layer formation 30 and subsequent He ion out-diffusion 20 during formation of a silicon oxide layer 40. See also FIG. 4, which illustrates a more simplified depiction of the silicon wafer 10 in cross section having a silicon oxide layer 40 having a thickness $D_2$ and the depth, $D_3$, of the resultant nanocavity layer, as measured from the oxidized front surface of the handle wafer and toward the central plane. For point of reference, FIG. 4 also provides peak He ion implant depth $D_1$ as measured from the pre-oxidized front surface of the handle wafer and toward the central plane. Notably, as silicon is consumed during thermal oxidation, the front surface layer of the silicon wafer becomes thicker. The ratio of consumed silicon (original thickness of the silicon) to the silicon oxide thickness is about 0.45:1. Stated another way, each approximately 0.45 micrometers thickness of silicon in the front surface region will grow in thickness to about 1 micrometer of silicon dioxide after oxidation. Accordingly, the distance between the implant plane and the interface of the oxidized surface layer and the bulk single crystal semiconductor region preferably is no greater than $D_1-0.45*D_2$ based on the original peak depth of the He implant damage layer. In some embodiments, the distance between the peak depth of the He implant plane and the interface of the oxidized surface layer and the bulk single crystal semiconductor region is within about 1000 angstroms, within about 500 angstroms, within about 200 angstroms, within about 100 angstroms, within about 50 angstroms, or even within about 10 angstroms. In some embodiments, the average thickness $D_2$ of the front oxidized surface layer is no more than about 2.2 times the value of the peak depth $D_1$. In some embodiments, the average thickness $D_2$ of the front oxidized surface layer is between about 0.2 micrometers and about 2 micrometers, or between about 0.4 micrometers and about 1 micrometer.

In some embodiments, the He ion implanted single crystal semiconductor handle substrate, e.g., a He ion implanted single crystal silicon handle wafer, may be thermally oxidized in a furnace such as an ASM A400. The temperature may range from 750° C. to 1100° C. in an oxidizing ambient. The oxidizing ambient atmosphere can be a mixture of inert gas, such as Ar or $N_2$, and $O_2$. The oxygen content may vary from 1 to 10 percent, or higher. In some embodiments, the oxidizing ambient atmosphere may be up to 100% (a "dry oxidation"). In some embodiments, the ambient atmosphere may comprise a mixture of inert gas, such as Ar or $N_2$, and oxidizing gases, such as $O_2$ and water vapor (a "wet oxidation"). In an exemplary embodiment, He ion implanted semiconductor handle wafers may be loaded into a vertical furnace, such as an A400. The temperature is ramped to the oxidizing temperature with a mixture of $N_2$ and $O_2$. At the desired temperature water vapor is introduced into the gas flow. After the desired oxide thickness has been obtained, the water vapor and $O_2$ are turned off and the furnace temperature is reduced and wafers are unloaded from the furnace. During the early stages of the thermal oxidization step the nanocavity layer is formed and the implanted He ions may out diffuse, thereby yielding a nanocavity layer at an average depth, $D_3$, as measured from the oxidized front surface of the handle wafer and toward the central plane. The nanocavity layer is generally at least about 0.05 micrometers thick. In some embodiments, the nanocavity layer is at least about 0.1 micrometers thick. In some embodiments, the nanocavity layer has a planar density of nanocavities between about $1 \times 10^7/cm^2$ to about $1 \times 10^{10}/cm^2$. In some embodiments, the nanocavity layer has a planar density of nanocavities between about $1 \times 10^7/cm^2$ to about $1 \times 10^9/cm^2$. The average depth, $D_3$, of the nanocavity layer may be between about 0.1 micrometers and about 5 micrometers, such as between about 0.1 micrometers and about 1 micrometers. In some embodiments, the distance between the nanocavity layer and a silicon oxide interface of the front oxidized surface layer average and the bulk region of the handle wafer is within about 1000 angstroms. In some embodiments, the distance between the nanocavity layer and a silicon oxide interface of the front oxidized surface layer average and the bulk region of the handle wafer is no more than about 500 angstroms, and in preferred embodiments, the distance between the nanocavity layer and a silicon oxide interface of the front oxidized surface layer average and the bulk region of the handle wafer is less than 200 angstroms, less than 100 angstroms, less than 50 angstroms, less than 10 angstroms, or even essentially congruent, i.e., no distance between the nanocavity layer and a silicon oxide interface.

After oxidation, wafer cleaning is optional. If desired, the wafers can be cleaned, for example, in a standard SC1/SC2 solution.

The single crystal semiconductor handle wafer prepared according to the method described herein to comprise an oxidized front surface layer and a nanocavity layer is next bonded a single crystal semiconductor donor substrate, e.g., a single crystal semiconductor donor wafer, which is prepared according to conventional layer transfer methods. That is, the single crystal semiconductor donor wafer may be subjected to standard process steps including oxidation, implant, and post implant cleaning. Accordingly, a single crystal semiconductor donor substrate, such as a single crystal semiconductor wafer of a material that is conventionally used in preparation of multilayer semiconductor structures, e.g., a single crystal silicon donor wafer, that has been etched and polished and optionally oxidized, is subjected to ion implantation to form a damage layer in the donor substrate. Ion implantation may be carried out in a commercially available instrument, such as an Applied Materials Quantum II. Implanted ions include He, H, or combinations thereof. In some embodiments it may be desirable to subject the single crystal semiconductor donor wafers, e.g., single crystal silicon donor wafers, to a clean after the implant. In some preferred embodiments, the clean could include a Piranha clean followed by a DI water rinse and SC1/SC2 cleans. In some embodiments of the present invention, the single crystal semiconductor donor substrate having a damage layer therein formed by helium ion and/or hydrogen ion implant is annealed at a temperature sufficient to form a thermally activated cleave plane in the single crystal semiconductor donor substrate. An example of a suitable tool might be a simple Box furnace, such as a Blue M model. In some preferred embodiments, the ion implanted single crystal semiconductor donor substrate is annealed at a temperature of from about 200° C. to about 350° C., from about 225° C. to about 325° C., preferably about 300° C. Thermal annealing may occur for a duration of from about 2 hours to about 10 hour, preferably a duration of about 8 hours. Thermal annealing within these temperatures ranges is sufficient to form a thermally activated cleave plane. After the thermal anneal to activate the cleave plane, the single crystal semiconductor donor substrate surface is preferably cleaned.

In some embodiments, the cleaned single crystal semiconductor donor substrate having the thermally activated cleave plane therein is subjected to oxygen plasma and/or nitrogen plasma surface activation. In some embodiments, the oxygen plasma surface activation tool is a commercially available tool, such as those available from EV Group, such as EVG®810LT Low Temp Plasma Activation System. The single crystal semiconductor donor wafer having the thermally activated cleave plane is loaded into the chamber. The chamber is evacuated and backfilled with $O_2$ to a pressure less than atmospheric to thereby create the plasma. The single crystal semiconductor donor wafer is exposed to this plasma for the desired time, which may range from about 1 second to about 120 seconds. Oxygen plasma surface oxidation is performed in order to render the front surface of the single crystal semiconductor donor substrate hydrophilic and amenable to bonding to a single crystal semiconductor handle substrate prepared according to the method described above to have a nanocavity layer and preferably a silicon oxide layer.

The hydrophilic front surface layer of the single crystal semiconductor donor substrate and the oxidized front surface of the single crystal semiconductor handle substrate having the nanocavity layer are next brought into intimate contact to thereby form a bonded structure. Since the mechanical bond is relatively weak, the bonded structure is further annealed to solidify the bond between the donor wafer and the carrier wafer. The bonded structure may be annealed at a temperature up to about 1200° C., such as between about 1000° C. and about 1200° C., preferably at a temperature of about 1125° C. The thermal anneal may have a duration between about 30 minutes hours and about 8 hours, preferably for about 4 hours.

After the thermal anneal, the bond between the single crystal semiconductor donor substrate and the single crystal semiconductor handle substrate is strong enough to initiate layer transfer via cleaving the bonded structure at the cleave plane. Cleaving may occur according to techniques known in the art. In some embodiments, the bonded structure may be placed in a conventional cleave station affixed to stationary suction cups on one side and affixed by additional suction cups on a hinged arm on the other side. A crack is initiated near the suction cup attachment and the movable arm pivots about the hinge cleaving the wafer apart. Cleaving removes a portion of the semiconductor donor wafer, thereby leaving a semiconductor device layer, preferably a silicon device layer, on the semiconductor-on-insulator composite structure.

After cleaving, in some embodiments, the cleaved structure is subjected to a high temperature anneal in order to further strengthen the bond between the transferred device layer and the single crystal semiconductor handle substrate. An example of a suitable tool might be a vertical furnace, such as an ASM A400. In some preferred embodiments, the bonded structure is annealed at a temperature of from about 1000° C. to about 1200° C., preferably at about 1000° C. Thermal annealing may occur for a duration of from about 0.5 hours to about 8 hours, preferably a duration of about 4 hours. Thermal annealing within these temperatures ranges is sufficient to strengthen the bond between the transferred device layer and the single crystal semiconductor handle substrate.

After the high temperature anneal and cleave, the bonded structure may be subjected to a cleaning process designed to remove thin thermal oxide and clean particulates from the surface. In some embodiments, the single crystal semiconductor donor wafer may be brought to the desired thickness and smoothness by subjecting to a vapor phase HCl etch process in a horizontal flow single wafer epitaxial reactor using $H_2$ as a carrier gas. The finished SOI wafer may then be subjected to end of line metrology inspections and cleaned a final time using typical SC1-SC2 process.

Having described the invention in detail, it will be apparent that modifications and variations are possible without departing from the scope of the invention defined in the appended claims.

EXAMPLE 1

Helium Ion Implant in Single Crystal Silicon Handle Wafers 200 mm single side polished single crystal silicon wafers with resistivity >750 ohm-cm (SunEdison, Inc.; St. Peters, Mo.) were implanted with He ions at an implant energy of 45 kEv and a dose of $4 \times 10^{16}$ atoms/cm$^2$. The handle wafers were cleaned using a Piranha clean process to remove organic and particulate contamination. The handle wafers were then subjected to a 1000° C. wet oxidation process to grow 7600 Å oxide. During early stage of the oxidation thermal cycle, a nanocavity layer formed and He was diffused out through the front wafer surface. The handle wafers were processed through an SC1-SC2 clean.

Single crystal silicon donor wafers were prepared for layer transfer via standard processes including oxidation, implant, post implant cleaning.

The front surfaces of the donor wafers and the front surfaces of the oxidized handle wafers containing a nanocavity layer were subjected to a nitrogen plasma activation process and were bonded. The bonded pairs were subjected to a short thermal cycle to complete the bonding process. The wafers were then mechanically cleaved causing transfer of the donor oxide and thin layer of Si from the donor wafer onto the handle wafer. The resulting SOI wafer was cleaned using an SC1-SC2 clean process and subjected to a high temperature anneal (4 h, 1125° C.) to further strengthen the bond interface. After the high temperature anneal the wafers were subjected to clean process designed to remove thin thermal oxide and clean particulates from the surface. The top Si of the SOI wafers was brought to target thickness and smoothness by subjecting to a vapor phase HCl etch process in a horizontal flow single wafer epitaxial reactor using $H_2$ as a carrier gas. The finished SOI wafer was then subjected to end of line metrology inspections and cleaned a final time using typical SC1-SC2 process.

As various changes could be made in the above compositions and processes without departing from the scope of the invention, it is intended that all matter contained in the above description be interpreted as illustrative and not in a limiting sense.

When introducing elements of the present invention or the preferred embodiment(s) thereof, the articles "a," "an," "the," and "said" are intended to mean that there are one or more of the elements. The terms "comprising," "including," and "having" are intended to be inclusive and mean that there may be additional elements other than the listed elements.

What is claimed is:

1. A method of preparing a single crystal semiconductor handle wafer, the method comprising:

implanting He ions through a front surface of the single crystal semiconductor handle wafer to thereby form an implant plane having a peak depth, $D_1$, as measured from the front surface of the single crystal semiconductor handle wafer and toward a central plane of the single crystal semiconductor handle wafer, the single crystal semiconductor handle wafer comprising two major, generally parallel surfaces, one of which is the front surface of the single crystal semiconductor handle wafer and the other of which is a back surface of the single crystal semiconductor handle wafer, a circumferential edge joining the front and back surfaces of the single crystal semiconductor handle wafer, a bulk single crystal semiconductor region, and the central plane of the single crystal semiconductor handle wafer between the front and back surfaces of the single crystal semiconductor handle wafer, wherein the single crystal semiconductor handle wafer has a minimum bulk resistivity of at least 100 ohm-cm, the peak depth $D_1$ comprises the depth of the highest concentration of He ions in the single crystal semiconductor handle wafer, and the peak depth $D_1$ is no greater than about 5 micrometers from the front surface of the single crystal semiconductor handle wafer; and thermally oxidizing the front surface of the single crystal semiconductor handle wafer at a temperature between about 750° C. and about 1100° C. to thereby prepare a front oxidized surface layer having an average thickness, $D_2$, as measured between a point on a surface of the front oxidized surface layer and an interface of the oxidized surface layer and the bulk single crystal semiconductor region and to further yield a nanocavity layer in the single crystal semiconductor handle wafer at an average depth, $D_3$, as measured from the oxidized front surface of the handle wafer and toward the central plane, wherein $D_3$ is between about 0.1 micrometers and about 5 micrometers.

2. The method of claim 1 wherein the single crystal semiconductor handle wafer comprises a material selected from the group consisting of silicon, germanium, and silicon germanium.

3. The method of claim 2 wherein the single crystal semiconductor handle wafer comprises a single crystal silicon handle wafer sliced from a single crystal silicon ingot grown by the Czochralski method.

4. The method of claim 3 wherein the single crystal silicon handle wafer has a bulk resistivity between about 100 ohm cm and about 100,000 ohm-cm.

5. The method of claim 3 wherein the single crystal silicon handle wafer has a bulk resistivity between about 500 ohm cm and about 10,000 ohm-cm.

6. The method of claim 3 wherein the single crystal silicon handle wafer has a bulk resistivity between about 750 ohm cm and about 10,000 ohm-cm.

7. The method of claim 1 wherein the single crystal semiconductor handle wafer has an average oxygen content of less than 10 ppma.

8. The method of claim 1 wherein the single crystal semiconductor handle wafer comprises a wafer having a minimum diameter of at least about 150 mm.

9. The method of claim 1 wherein the He ions are implanted at a dose between about $5\times10^{15}$ atoms/cm$^2$ and about $5\times10^{17}$ atoms/cm$^2$.

10. The method of claim 1 wherein the He ions are implanted at a dose between about $1\times10^{16}$ atoms/cm$^2$ and about $1\times10^{17}$ atoms/cm$^2$.

11. The method of claim 1 wherein the He ions are implanted at an energy between about 10 keV and about 300 keV.

12. The method of claim 1 wherein the He ions are implanted at an energy between about 20 keV and about 200 keV.

13. The method of claim 1 wherein the peak depth $D_1$ is between about 0.1 micrometers and about 1 micrometers as measured from the front surface of the single crystal semiconductor handle wafer and toward the central plane of single crystal semiconductor handle wafer.

14. The method of claim 1 wherein the peak depth $D_1$ is between about 0.2 micrometers and about 0.5 micrometers as measured from the front surface of the single crystal semiconductor handle wafer and toward the central plane of the single crystal semiconductor handle wafer.

15. A method of preparing a single crystal semiconductor handle wafer, the method comprising:

implanting He ions through a front surface of the single crystal semiconductor handle wafer to thereby form an implant plane having a peak depth, $D_1$, as measured from the front surface of the single crystal semiconductor handle wafer and toward a central plane of the single crystal semiconductor handle wafer, the single crystal semiconductor handle wafer comprising two major, generally parallel surfaces, one of which is the front surface of the single crystal semiconductor handle wafer and the other of which is a back surface of the single crystal semiconductor handle wafer, a circumferential edge joining the front and back surfaces of the single crystal semiconductor handle wafer, a bulk single crystal semiconductor region, and the central plane of the single crystal semiconductor handle wafer between the front and back surfaces of the single crystal semiconductor handle wafer, wherein the single crystal semiconductor handle wafer has a minimum bulk resistiviy of at least 100 ohm-cm, the peak depth $D_1$ comprises the depth of the highest concentration of He ions in the single crystal semiconductor handle wafer, and the peak depth $D_1$ is no greater than about 5 micrometers from the front surface of the single crystal semiconductor handle wafer;

thermal annealing the He ion implanted single crystal semiconductor handle wafer in an inert gas environment at a temperature between about 750° C. and about 1100° C. to form a nanocavity layer in the single crystal semiconductor handle wafer; and thermally oxidizing the front surface of the single crystal semiconductor handle wafer comprising the nanocavity layer at a temperature between about 750° C. and about 1100° C. to thereby prepare a front oxidized surface layer having an average thickness, $D_2$, as measured between a point on a surface of the front oxidized surface layer and an interface of the oxidized surface layer and the bulk single crystal semiconductor region.

16. The method of claim 1 wherein the average thickness $D_2$ of the front oxidized surface layer is no more than about 2.2 times the value of the peak depth $D_1$.

17. The method of claim 1 wherein the average thickness $D_2$ of the front oxidized surface layer is between about 0.2 micrometers and about 2 micrometers.

18. The method of claim 1 wherein the average thickness $D_2$ of the front oxidized surface layer is between about 0.4 micrometers and about 1 micrometers.

19. The method of claim 1 wherein the distance between the implant plane and the interface of the oxidized surface layer and the bulk single crystal semiconductor region is a value no greater than $D_1 - 0.45 \cdot D_2$.

20. The method of claim 1 wherein the distance between the implant plane and the interface of the oxidized surface layer and the bulk single crystal semiconductor region is within about 1000 angstroms.

21. The method of claim 1 wherein the distance between the implant plane and the interface of the oxidized surface layer and the bulk single crystal semiconductor region is within about 100 angstroms.

22. The method of claim 1 further comprising:
bonding the front oxidized surface layer of the single crystal semiconductor handle wafer to a front surface of a single crystal semiconductor donor wafer to thereby prepare a bonded structure, wherein the single crystal semiconductor donor wafer comprises two major, generally parallel surfaces, one of which is the front surface of the single crystal semiconductor donor wafer and the other of which is a back surface of the single crystal semiconductor donor wafer, a circumferential edge joining the front and back surfaces of the single crystal semiconductor donor wafer, and a central plane of the single crystal semiconductor donor wafer between the front and back surfaces of the single crystal semiconductor donor wafer, wherein the single crystal semiconductor donor wafer comprises a cleave plane.

23. The method of claim 22 wherein the single crystal semiconductor donor wafer comprises a single crystal silicon donor wafer sliced from a single crystal silicon ingot grown by the Czochralski method.

24. The method of claim 22 wherein the front surface of the single crystal silicon donor wafer comprises a silicon oxide layer.

25. The method of claim 22 further comprising heating the bonded structure at a temperature and for a duration sufficient to strengthen the bond between the front oxidized surface layer of the single crystal semiconductor handle wafer and the front surface of a single crystal silicon donor wafer.

26. The method of claim 22 further comprises mechanically cleaving the bonded structure at the cleave plane of the single crystal silicon donor wafer.

27. The method of claim 1 further comprising transferring a device layer onto the front oxidized surface layer of the single crystal semiconductor handle wafer.

28. A method of preparing a silicon-on-insulator structure, the method comprising:
bonding a front surface of a single crystal silicon handle substrate and a front surface of a single crystal silicon donor substrate;
wherein the single crystal silicon handle substrate comprises two major, generally parallel surfaces, one of which is the front surface of the single crystal silicon handle substrate and the other of which is a back surface of the single crystal silicon handle substrate, a circumferential edge joining the front and back surfaces of the single crystal silicon handle substrate, and a central plane of the single crystal silicon handle substrate between the front and back surfaces of the single crystal silicon handle substrate, wherein the single crystal silicon handle substrate has a minimum bulk resistivity of 100 ohm-cm, the front surface of the single crystal silicon handle substrate comprises an oxidized front surface layer, and the single crystal silicon handle substrate comprises a nanocavity layer having an average depth, $D_3$, as measured from a point on the oxidized front surface of the single crystal silicon handle substrate and toward the central plane of the single crystal silicon handle substrate wherein $D_3$ is between about 0.1 micrometers and about 5 micrometers and further wherein the nanocavity layer is at least 0.05 micrometers thick; and
wherein the single crystal silicon donor substrate comprises two major, generally parallel surfaces, one of which is the front surface of the single crystal silicon donor substrate and the other of which is a back surface of the single crystal silicon donor substrate, a circumferential edge joining the front and back surfaces of the single crystal silicon donor substrate, and a central plane of the single crystal silicon donor substrate between the front and back surfaces of the single crystal silicon donor substrate, wherein the single crystal silicon donor substrate comprises a cleave plane.

29. The method of claim 28 wherein the single crystal silicon handle substrate comprises a wafer sliced from a single crystal silicon ingot grown by the Czochralski method.

30. The method of claim 29 wherein the single crystal silicon handle substrate has a bulk resistivity between about 50 ohm-cm and about 100,000 ohm-cm.

31. The method of claim 29 wherein the single crystal silicon handle substrate has a bulk resistivity between about 500 ohm-cm and about 10,000 ohm-cm.

32. The method of claim 29 wherein the single crystal silicon handle substrate has an average oxygen content of less than 10 ppma.

33. The method of claim 28 wherein $D_3$ is between about 0.1 micrometers and about 5 micrometers.

34. The method of claim 33 wherein the distance between the nanocavity layer and a silicon oxide interface of the front oxidized surface layer average and the bulk region of the single crystal silicon handle substrate is within about 1000 angstroms.

35. The method of claim 33 wherein the distance between the nanocavity layer and a silicon oxide interface of the front oxidized surface layer average and the bulk region of the single crystal silicon handle substrate is within about 100 angstroms.

36. The method of claim 28 wherein $D_3$ is between about 0.1 micrometers and about 1 micrometers.

37. The method of claim 36 wherein the distance between the nanocavity layer and a silicon oxide interface of the front oxidized surface layer average and the bulk region of the single crystal silicon handle substrate is within about 1000 angstroms.

38. The method of claim 36 wherein the distance between the nanocavity layer and a silicon oxide interface of the front oxidized surface layer average and the bulk region of the single crystal silicon handle substrate is between about 100 angstroms and about 1000 angstroms.

39. The method of claim 28 wherein the nanocavity layer is at least 0.1 micrometers thick.

40. The method of claim 28 wherein the nanocavity layer has a planar density of nanocavities between about $1 \times 10^7/\text{cm}^2$ to about $1 \times 10^{10}/\text{cm}^2$.

41. The method of claim 28 further comprising heating the bonded structure at a temperature and for a duration sufficient to strengthen the bond between the front oxidized surface layer of the single crystal silicon handle substrate and the front surface of a single crystal silicon donor substrate.

42. The method of claim 28 further comprising mechanically cleaving the bonded structure at the cleave plane of the single crystal silicon donor substrate.

43. A method of preparing a silicon-on-insulator structure, the method comprising:

implanting He ions through a front surface of a single crystal semiconductor handle wafer to thereby form an implant plane having a peak depth, $D_1$, as measured from the front surface of the single crystal semiconductor handle wafer and toward a central plane of the single crystal semiconductor handle wafer, the single crystal semiconductor handle wafer comprising two major, generally parallel surfaces, one of which is the front surface of the handle wafer and the other of which is a back surface of the handle wafer, a circumferential edge joining the front and back surfaces of the handle wafer, a bulk single crystal semiconductor region, and the central plane of the single crystal semiconductor handle wafer between the front and back surfaces of the single crystal semiconductor handle wafer, wherein the single crystal semiconductor handle wafer has a minimum bulk resistivity of at least 100 ohm-cm, the peak depth $D_1$ comprises the depth of the highest concentration of He ions in the single crystal semiconductor handle wafer, and the peak depth $D_1$ is no greater than about 5 micrometers from the front surface of the single crystal semiconductor handle wafer;

thermal annealing the He ion implanted single crystal semiconductor handle wafer to form a nanocavity layer in the single crystal semiconductor handle wafer at an average depth, $D_3$, as measured from a point on the front surface of the single crystal silicon handle substrate and toward the central plane of the single crystal silicon handle substrate wherein $D_3$ is between about 0.1 micrometers and about 5 micrometers and further wherein the nanocavity layer is at least 0.05 micrometers thick; and bonding the front surface of the single crystal semiconductor handle wafer and a front surface of a single crystal silicon donor substrate, wherein the single crystal silicon donor substrate comprises two major, generally parallel surfaces, one of which is the front surface of the single crystal silicon donor substrate and the other of which is a back surface of the single crystal silicon donor substrate, a circumferential edge joining the front and back surfaces of the single crystal silicon donor substrate, a central plane of the single crystal silicon donor substrate between the front and back surfaces of the single crystal silicon donor substrate, and a cleave plane.

44. The method of claim 43 wherein the single crystal semiconductor handle wafer comprises a material selected from the group consisting of silicon, germanium, and silicon germanium.

45. The method of claim 44 wherein the single crystal semiconductor handle wafer comprises a single crystal silicon handle wafer sliced from a single crystal silicon ingot grown by the Czochralski method.

46. The method of claim 45 wherein the single crystal silicon handle wafer has a bulk resistivity between about 100 ohm-cm and about 100,000 ohm-cm.

47. The method of claim 45 wherein the single crystal silicon handle wafer has a bulk resistivity between about 500 ohm-cm and about 10,000 ohm-cm.

48. The method of claim 45 wherein the single crystal silicon handle wafer has a bulk resistivity between about 750 ohm-cm and about 10,000 ohm-cm.

49. The method of claim 43 wherein the single crystal semiconductor handle wafer has an average oxygen content of less than 10 ppma.

50. The method of claim 43 wherein the single crystal semiconductor handle wafer comprises a wafer having a minimum diameter of at least about 150 mm.

51. The method of claim 43 wherein the He ions are implanted at a dose between about $5 \times 10^{15}$ atoms/cm$^2$ and about $5 \times 10^{17}$ atoms/cm$^2$.

52. The method of claim 43 wherein the He ions are implanted at a dose between about $1 \times 10^{16}$ atoms/cm$^2$ and about $1 \times 10^{17}$ atoms/cm$^2$.

53. The method of claim 43 wherein the He ions are implanted at an energy between about 10 keV and about 300 keV.

54. The method of claim 43 wherein the He ions are implanted at an energy between about 20 keV and about 200 keV.

55. The method of claim 43 wherein the peak depth $D_1$ is between about 0.1 micrometers and about 1 micrometers as measured from the front surface of the single crystal semiconductor handle wafer and toward a central plane of single crystal semiconductor handle wafer.

56. The method of claim 43 wherein the peak depth $D_1$ is between about 0.2 micrometers and about 0.5 micrometers as measured from the front surface of the single crystal semiconductor handle wafer and toward a central plane of the single crystal semiconductor handle wafer.

57. The method of claim 43 wherein the nanocavity layer is at least 0.1 micrometers thick.

58. The method of claim 43 wherein the nanocavity layer has a planar density of nanocavities between about $1 \times 10^7$/cm$^2$ to about $1 \times 10^{10}$/cm$^2$.

59. The method of claim 43 further comprising heating the bonded structure at a temperature and for a duration sufficient to strengthen the bond between the front surface layer of the single crystal semiconductor handle wafer and the front surface of a single crystal silicon donor substrate.

60. The method of claim 43 further comprising mechanically cleaving the bonded structure at the cleave plane of the single crystal silicon donor substrate.

* * * * *